(12) United States Patent
Lalancette et al.

(10) Patent No.: US 9,099,845 B2
(45) Date of Patent: Aug. 4, 2015

(54) METER SOCKET WITH CURRENT BYPASS

(71) Applicant: Thomas & Betts International, Inc., Wilmington, DE (US)

(72) Inventors: Daniel Lalancette, St-Jean-sur-Richelieu (CA); Yves Boucher, St-Jean-sur-Richelieu (CA); Marie-Eve Bernard, St-Jean-sur-Richelieu (CA); Michele Di Lillo, Chambly (CA)

(73) Assignee: Thomas & Betts International, Inc., Wilmington, DE (US)

( * ) Notice: Subject to any disclaimer, the term of this patent is extended or adjusted under 35 U.S.C. 154(b) by 276 days.

(21) Appl. No.: 13/785,211

(22) Filed: Mar. 5, 2013

(65) Prior Publication Data
US 2013/0279086 A1    Oct. 24, 2013

Related U.S. Application Data

(60) Provisional application No. 61/636,819, filed on Apr. 23, 2012.

(51) Int. Cl.
*H02B 1/00* (2006.01)
*G01R 11/00* (2006.01)
*H02B 1/03* (2006.01)
*G01R 11/04* (2006.01)
*G01R 22/06* (2006.01)

(52) U.S. Cl.
CPC ................. *H02B 1/03* (2013.01); *G01R 11/04* (2013.01); *G01R 22/065* (2013.01)

(58) Field of Classification Search
CPC ........ H02B 1/03; G01R 11/04; G01R 22/065; G01R 1/04; G01D 11/24
USPC ........................... 361/659–672; 439/517, 188
See application file for complete search history.

(56) References Cited

U.S. PATENT DOCUMENTS

| | | | |
|---|---|---|---|
| 2,838,627 A * | 6/1958 | Kuhn et al. ................. | 200/51.1 |
| 3,029,322 A * | 4/1962 | Waldrop ...................... | 200/51.1 |
| 3,132,289 A * | 5/1964 | Russo .......................... | 361/662 |
| 3,263,130 A * | 7/1966 | Duvall ......................... | 361/662 |
| 3,599,047 A | 8/1971 | Magarian | |
| 4,107,484 A | 8/1978 | Petersen, III | |
| 5,045,969 A | 9/1991 | Menasco | |
| 5,546,269 A | 8/1996 | Robinson et al. | |
| 5,775,942 A | 7/1998 | Jeffcoat | |
| 6,520,798 B1 | 2/2003 | Robinson et al. | |
| 6,545,374 B1 | 4/2003 | Allenbach | |
| 6,663,405 B1 | 12/2003 | Robinson et al. | |
| 6,679,723 B1 | 1/2004 | Robinson | |

(Continued)

FOREIGN PATENT DOCUMENTS

| | | |
|---|---|---|
| CA | 2040274 C | 5/1994 |
| CA | 2172461 C | 11/1999 |

(Continued)

*Primary Examiner* — Zachary M Pape
(74) *Attorney, Agent, or Firm* — Snyder, Clark, Lesch & Chung, LLP

(57) ABSTRACT

A meter socket for a meter box includes a set of meter jaws to receive a watt-hour meter, a bypass conductor member to selectively connect the meter jaws and provide a bypass for the watt-hour meter, and an activator for the bypass conductor member. The activator is configured to be activated by a user through a closed meter box to move the bypass conductor member from a metered position to a bypass position.

20 Claims, 17 Drawing Sheets

(56) References Cited

U.S. PATENT DOCUMENTS

| | | |
|---|---|---|
| 6,752,652 B1 | 6/2004 | Robinson |
| 6,823,563 B2 | 11/2004 | Robinson et al. |
| 6,846,199 B1 | 1/2005 | Robinson et al. |
| 6,975,504 B2 | 12/2005 | Robinson et al. |
| 7,182,632 B1 | 2/2007 | Johnson, Jr. et al. |
| 7,315,442 B2 | 1/2008 | Robinson |
| 7,327,558 B2 | 2/2008 | Kennedy et al. |
| 7,362,232 B2 | 4/2008 | Holle et al. |
| 7,458,846 B2 | 12/2008 | Loehr et al. |
| 7,611,366 B2 | 11/2009 | Davis |
| 7,815,066 B2 | 10/2010 | Desmeules |
| 2010/0128418 A1 | 5/2010 | Pruehs et al. |

FOREIGN PATENT DOCUMENTS

| | | |
|---|---|---|
| CA | 2215081 C | 6/2004 |
| CA | 2254252 C | 3/2005 |
| CA | 2509477 A1 | 3/2006 |
| CA | 2662072 A1 | 3/2008 |
| CA | 2663125 A1 | 3/2008 |
| CA | 2662927 A1 | 5/2008 |
| CA | 2487576 C | 1/2009 |
| CA | 2449876 C | 4/2010 |
| CA | 2610552 C | 1/2012 |

* cited by examiner

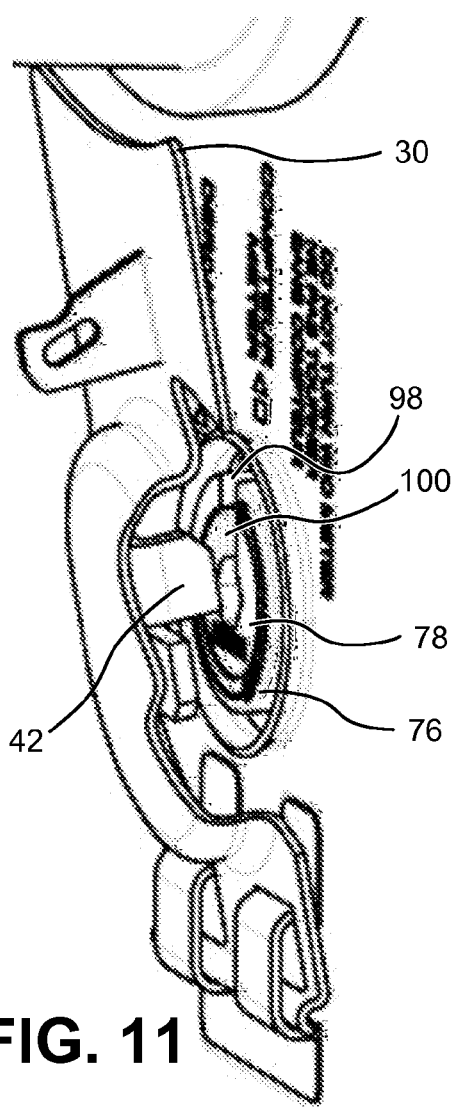
FIG. 11
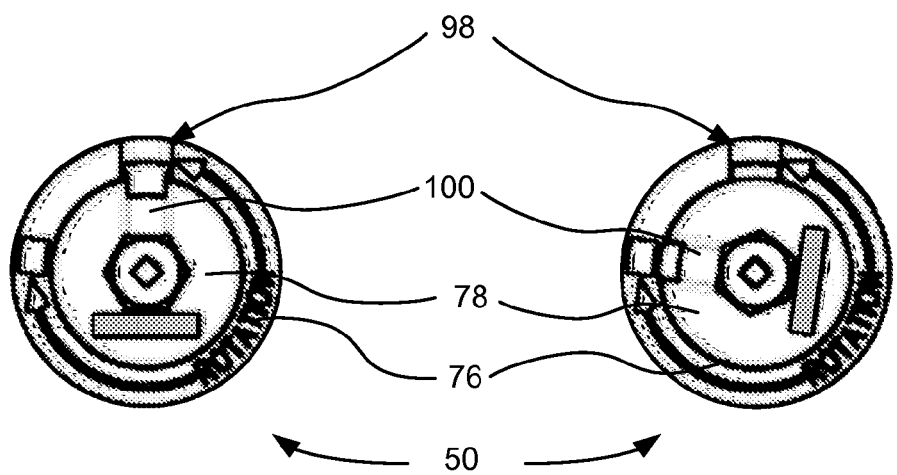
FIG. 12  FIG. 13

METER SOCKET WITH CURRENT BYPASS

RELATED APPLICATION

This application claims priority under 35 U.S.C. §119, based on U.S. Provisional Patent Application No. 61/636,819, filed Apr. 23, 2012, the disclosure of which is hereby incorporated by reference herein.

BACKGROUND INFORMATION

In the electric utility industry, plug-in, socket-type, watt-hour meters are commonly used to measure electric power consumption at residential or commercial sites. The most common type is more properly known as a kilowatt hour meter or a joule meter. When used in electricity retailing, the utilities record the values measured by these meters to generate an invoice for the electricity. These meters may also record other variables including the time when the electricity was used.

The socket for the watt-hour meter is usually installed in a housing that is mounted on a wall of the residence or commercial building. Typically, the housing is transparent or has an opening so that the meter can be read without opening the housing. The meter socket contains line and load terminals which are respectively connected to electric line and load connectors. The line and load connectors are connected to cables providing electrical power to/from the meter socket. The terminals receive the blade contacts of a plug-in watt-hour meter to complete an electric circuit through the meter between the line and load terminals.

BRIEF DESCRIPTION OF THE DRAWINGS

FIG. 11 is a cutaway perspective view of the bypass activator cover plate in a partially-closed orientation;

FIG. 12 is a front view of the bypass activator of FIG. 3 in a metered position;

FIG. 13 is a front view of the bypass activator of FIG. 3 in a bypass position;

DETAILED DESCRIPTION OF PREFERRED EMBODIMENTS

The following detailed description refers to the accompanying drawings. The same reference numbers in different drawings may identify the same or similar elements. Also, the following detailed description does not limit the invention.

In some instances, an electric meter may need to be removed from a meter box for service or replacement (e.g., due to a terminal failure or malfunction). One method for removal of an electric meter requires temporarily cutting off electricity to the building associated with the removed electric meter. However, to prevent the inconvenience of a power disruption, some meter sockets include a bypass mechanism that allows the electric current to bypass the electric meter and flow directly from the utility line power source to a building. When bypassed, the electric meter may be removed from the meter socket without interrupting service to the customer.

Current meter sockets with bypass mechanisms require the front cover of the meter box to be removed before the bypass mechanism can be enabled. When the front cover is removed, the meter jaws of the meter socket are still energized, exposing an electrician to a risk of electrical shock as the electrician reaches into the meter box to access the bypass mechanism.

According to implementations described herein, a meter socket for a meter box may include a set of meter jaws to receive a watt-hour meter; a bypass conductor member to selectively connect the meter jaws and provide a bypass for the watt-hour meter; and an activator for the bypass conductor member. The activator may be configured to be activated by a user through a closed meter box to move the bypass conductor member from a metered position to a bypass position.

Figure 1:
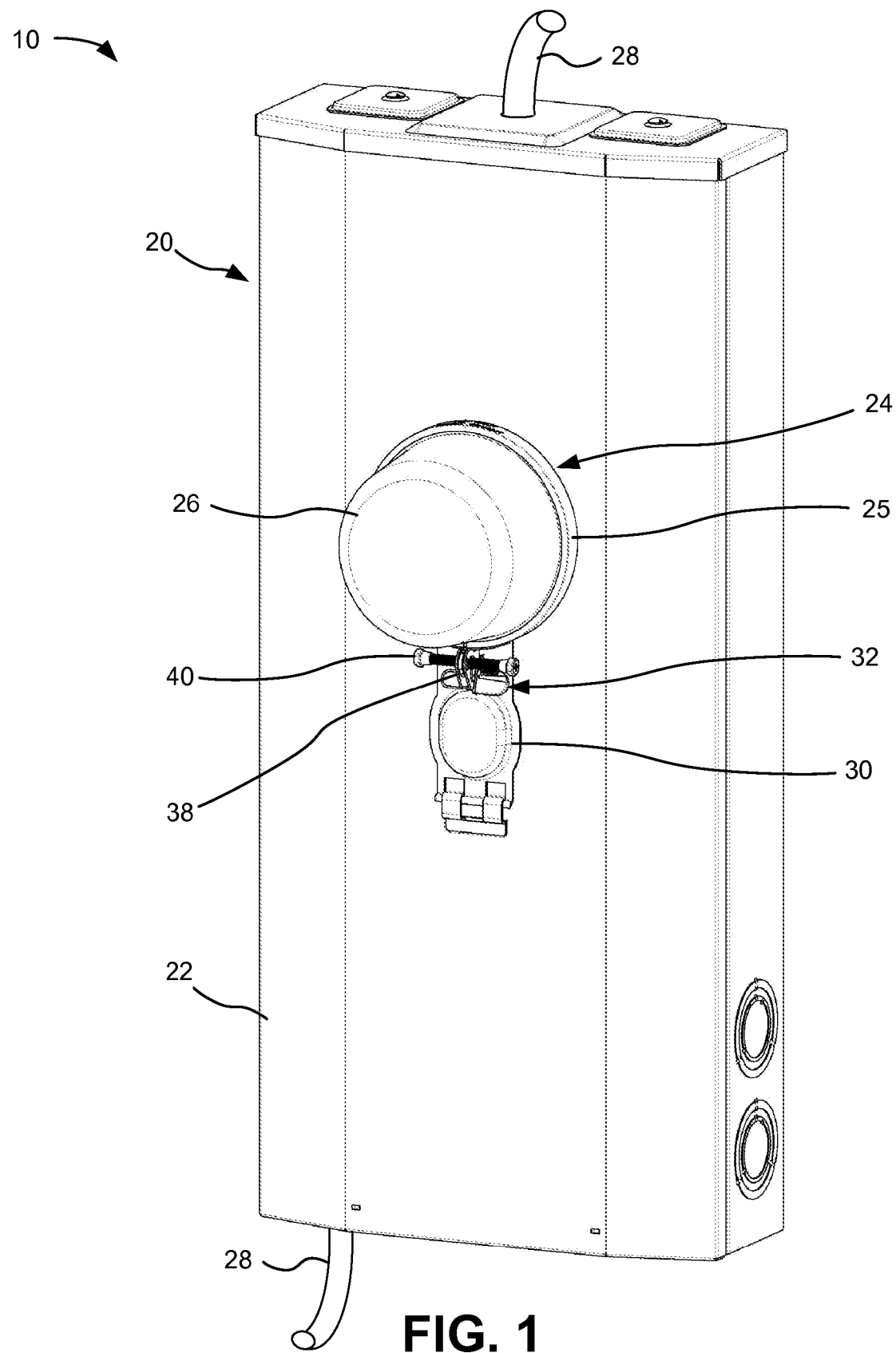
FIG. 1 is a front perspective view of a watt-hour meter assembly with a current bypass according to an implementation described herein.

FIG. 1 is a front perspective view of a watt-hour meter assembly 10 with a current bypass according to an implementation described herein. As shown in FIG. 1, watt-hour assembly 10 is configured for receiving overhead service feeds. Configurations for underground service feeds may be similar. In the configuration of FIG. 1, a meter box 20 may include removable front cover 22 or door with a hole 24 in which a watt-hour meter 26 may extend through. Meter box 20 may include openings in side and/or end walls for receiving cables 28 (e.g., line and/or load cables) to provide power to an associated building. Front cover 22 may include a bypass activator cover plate 30 that may be closed/sealed with a seal 32.

Figure 2:
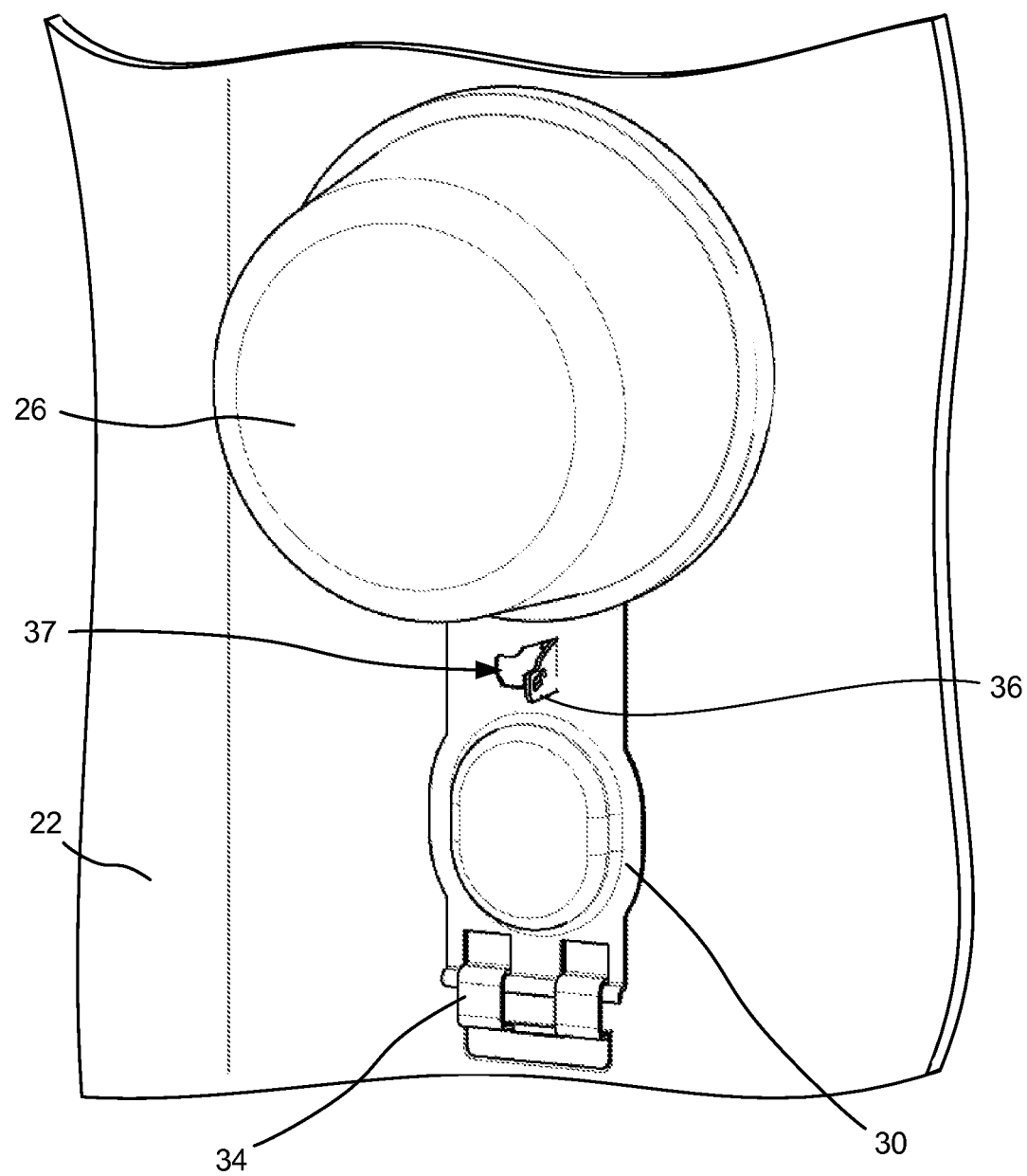
FIG. 2 is an enlarged view of a portion of FIG. 1 showing a closed bypass activator cover plate with a sealing ring removed.
Figure 3:
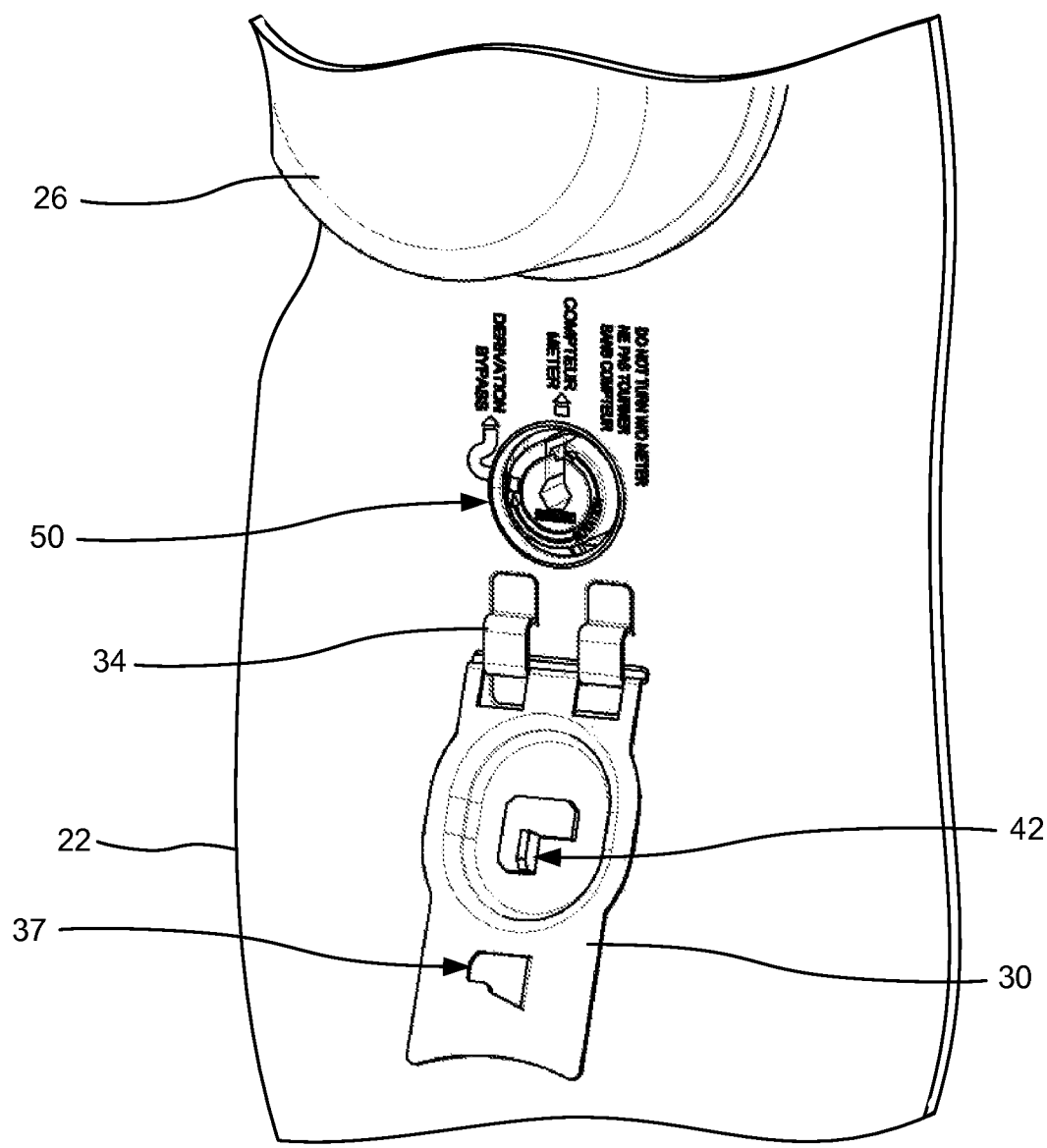
FIG. 3 is an enlarged front perspective view of a portion of the watt-hour meter assembly of FIG. 1 showing an open bypass activator cover plate.

FIG. 2 is an enlarged view of a portion of FIG. 1 showing bypass activator cover plate 30 in a closed (or sealed) configuration with a sealing ring 25 removed, and FIG. 3 provides a similar perspective showing bypass activator cover plate 30 in an open position. Referring collectively to FIGS. 1 through 3, cover plate 30 may include a hinge 34 and a securing tab 36. Hinge 34 may allow cover plate 30 to swing between an open and closed position. In one implementation, securing tab 36 may be cut/folded out of cover plate 30 leaving an aperture 37. When cover plate 30 is in a closed position, securing tab 36 may align with brackets 38, as shown in FIG. 1. Brackets 38 may be part of sealing ring 25 to retain watt-hour meter 26. Brackets 38 may be configured to receive a retention screw 40 to secure watt-hour meter 26 within hole 24. In one implementation, as shown in herein, seal 32 may be a common component with retention mechanisms for watt-hour meter 26 (e.g., brackets 38 and retention screw 40) and may pass through both securing tab 36 and brackets 38 to simultaneously seal both watt-hour meter 26 and cover plate 30. Thus, a separate seal for cover plate 30 is not required.

When in an open position (as shown in FIG. 3), cover plate 30 allows access to a bypass activator 50. As described further herein, cover plate 30 may include an indexing protrusion 42 that may prevent closure of cover plate 30 when bypass activator 50 is in a bypass orientation.

Bypass activator 50 may include a keyed recess, such as an allen key recess, that activates/deactivates a current bypass system in watt-hour meter assembly 10. Bypass activator 50 may accept rotational movement from a key. As described further herein, a system of gears may translate torque applied to bypass activator 50 into a linear motion for the bypass. Thus, in a case of having to change out meter 26, front cover 22 does not need to be removed to activate a current bypass within meter box 20.

Figure 4:
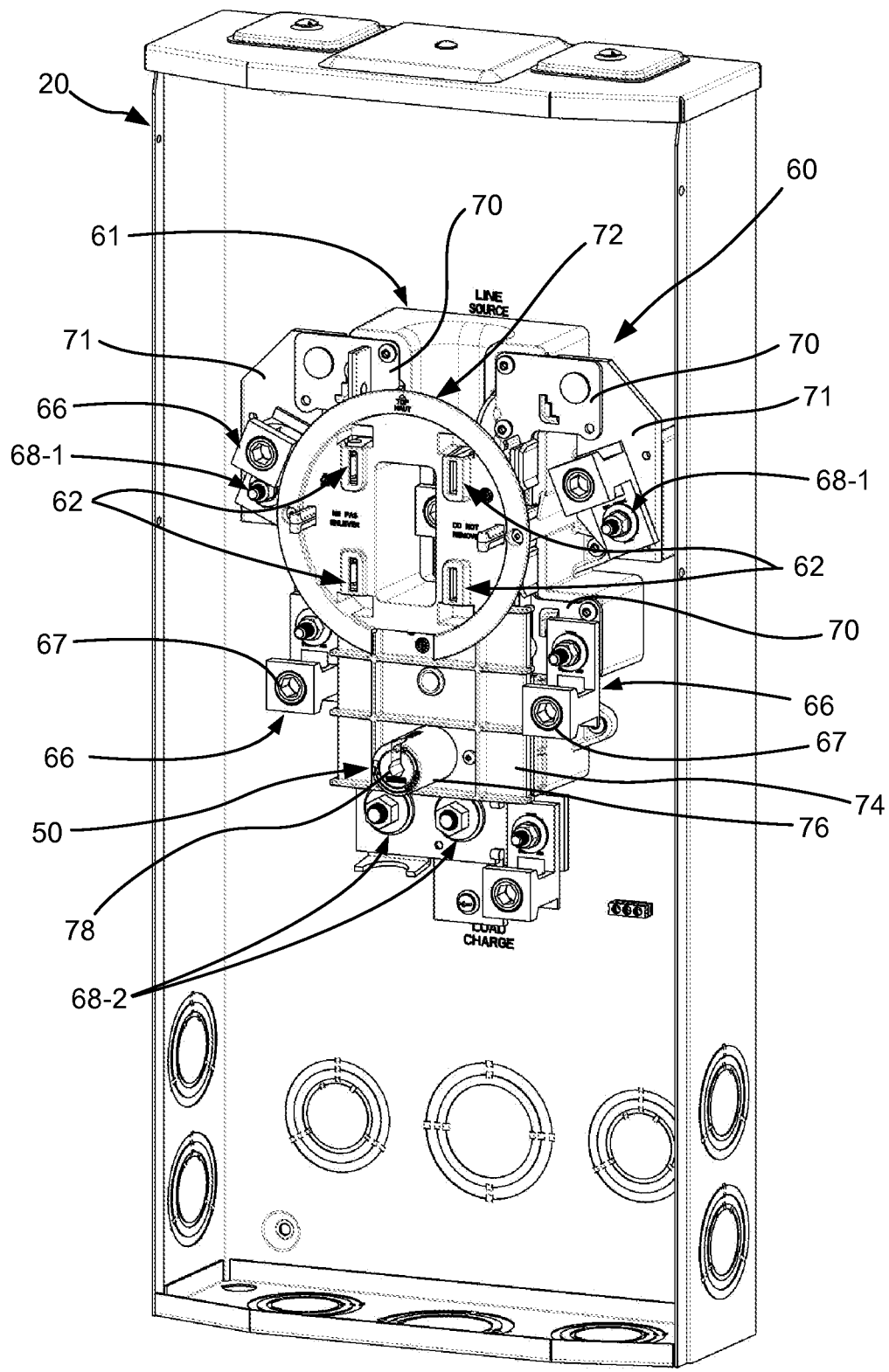
FIG. 4 is a front perspective view of the inside of the watt-hour meter assembly of FIG. 1.

FIG. 4 is a front perspective view of the inside of the watt-hour meter assembly 10. As shown in FIG. 4, a meter socket 60 may be mounted to a panel attached to the back wall of meter box 20.

Meter 26 may be coupled to a plurality of bus members or lines at meter socket 60. As shown in the preceding figures, meter 26 typically includes a cylindrically-shaped enclosure. The enclosure may contain a metering device with the meter display on the front side and a plurality of blade connectors (not shown) extending from the back side. The blade connectors may be adapted to be received by jaw-type terminals in meter socket 60 to electrically connect the line and load buses (e.g., associated with cables 28) through meter 26.

Meter socket 60 may include a non-conductive base 61, jaw-type terminals 62, bypass conductor members 64 (visible in FIGS. 5 and 6A), tunnel-type connectors 66, studs 68-1 and 68-2 (referred to herein collectively as "studs 68"), conductive plates 70, and/or bus bars. In the implementation of FIG. 4, each of jaw-type terminals 62 may be integral with one of conductive plates 70.

Terminals 62 may receive the blade contacts (not shown) of meter 26. The openings of terminals 62 face away from the front of meter socket 60 to allow easy insertion of the blade connectors of meter 26. As described further herein, bypass conductor members 64 may be used to short the line and load contacts by operation of a gear assembly. For example, bypass conductor members 64 (shown in FIG. 5) may be moved to an open (e.g., metered) position by placing an insulative material against bypass conductor member 64 to move bypass conductor member 64 out of electrical contact with some or all of the jaw-type terminals 62.

Connector 66 may include, for example, a conventional power line fitting, such as a solderless-type lug that may use a retaining screw 67 to clamp a conductive lead (e.g., from cables 28) within connector 66. Each of connectors 66 may be attached to non-conductive base 61 and one of the conductive plates 70 or bus bars 71.

Studs 68-1 may be provided as attachment points for line connectors (not shown) and studs 68-2 may provide attachment points for neutral connectors (not shown). For example, studs 68 may be configured to receive a compression lug, such as an underground compression lug 120 (FIG. 19) or another connector, depending on requirements for particular high voltage installations. Studs 68 may provide for connectivity to other components of meter socket 60 via a respective bus bar.

In one implementation, a meter security guard 72 may be mounted to non-conductive base 61. Meter security guard 72 may generally include a non-electrically conductive, transparent/translucent plate. As described further herein, meter security guard 72 permit connections between blades of meter 26 and meter jaws 62 while preventing user access to other components of meter socket 60. Additionally, meter socket 60 may include a gear cover 74 that is also mounted to non-conductive base 61. Gear cover 74 may prevent access and/or contamination of the bypass system gears (described further below). Both meter security guard 72 and gear cover 74 may be attached to non-conductive base 61 using mounting screws or other mechanical attachments.

Bypass activator 50 may include a lock sleeve 76 that stabilizes a rotating key shaft 78. As described further herein, lock sleeve 76 and key shaft 78 may include indexing mechanisms that are aligned when bypass activator 50 is in the fully metered (e.g., not bypassed) position. The indexing mechanisms of lock sleeve 76 and key shaft 78 must be aligned to properly close cover plate 30.

Figure 5:
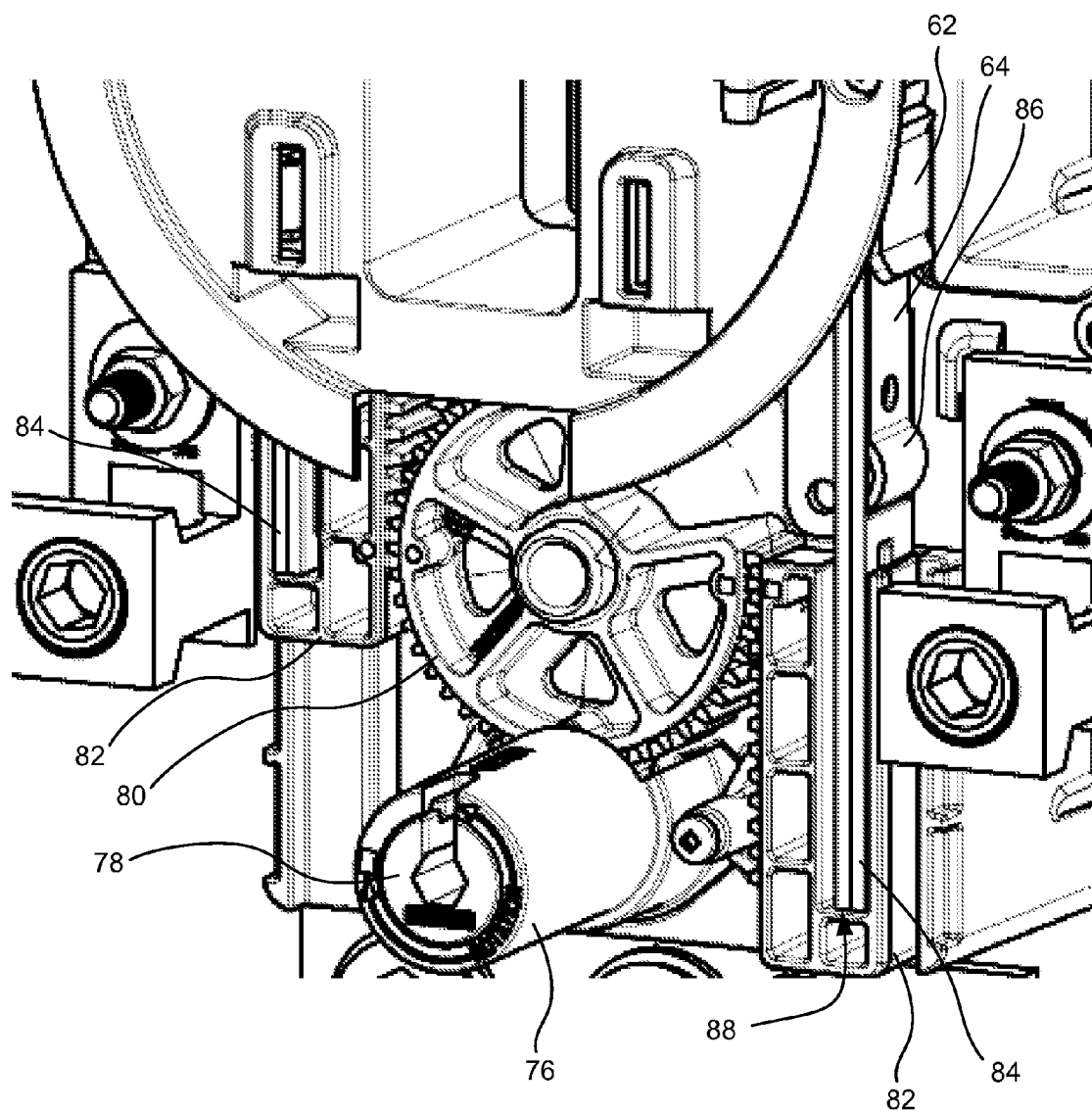
FIG. 5 is an enlarged front perspective view of a portion of the inside of the watt-hour meter assembly of FIG. 1 with the gear cover removed.
Figure 20:
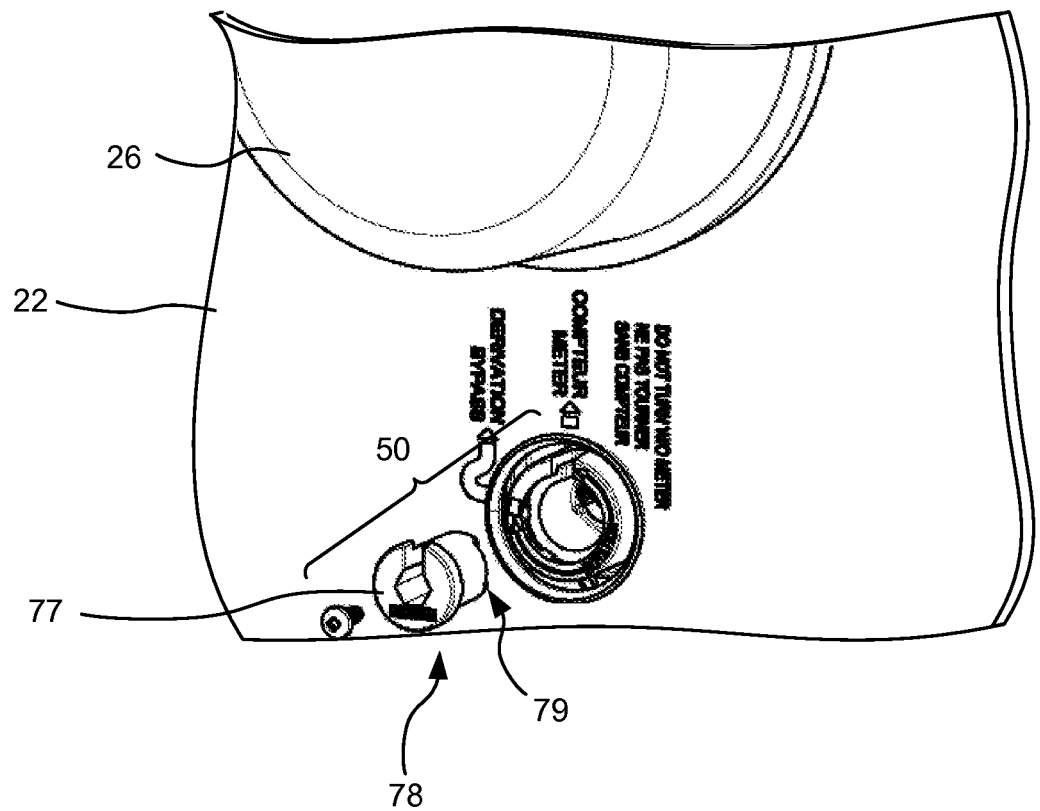
FIG. 20 provides a partially-exploded view of the bypass activator of FIG. 3 according to an implementation described herein.

FIG. 5 is an enlarged front perspective view of a portion of the inside of the watt-hour meter assembly 10 with gear cover 74 removed. Key shaft 78 may include teeth (not visible) that rotate when a rotational force is applied to key shaft 78. The teeth of key shaft 78 may engage with a translating gear 80. Translating gear 80 may, in turn, engage with teeth of a linear bypass guide 82 to impart linear motion to bypass conductor holder 84. FIG. 20 provides a partially-exploded view of bypass activator 50. In one implementation, as shown in FIG. 20, key shaft 78 may be formed from an upper part and lower part (not visible). Upper part 77 may include an alien key recess, and the bottom part may include the teeth that engage translating gear 80. In this two part configuration, upper part 77 and the lower part of key shaft 78 may be coupled with projections 79 that can break if they are over-torqued. Upper part 77 may be provided as a replaceable insert.

Bypass conductor holder 84 may include a non-conductive material that secures bypass conductor member 64. Linear bypass guide 82, bypass conductor holder 84, and bypass conductor member 64 may be generally constrained (e.g., within non-conductive base 61) to a path of linear travel. Bypass conductor member 64 may include protrusions 86 that may selectively engage and disengage a portion of a meter jaw 62. Linear bypass guide 82 may include a channel 88 that permits some lateral movement of bypass conductor holder 84.

Figure 6A:
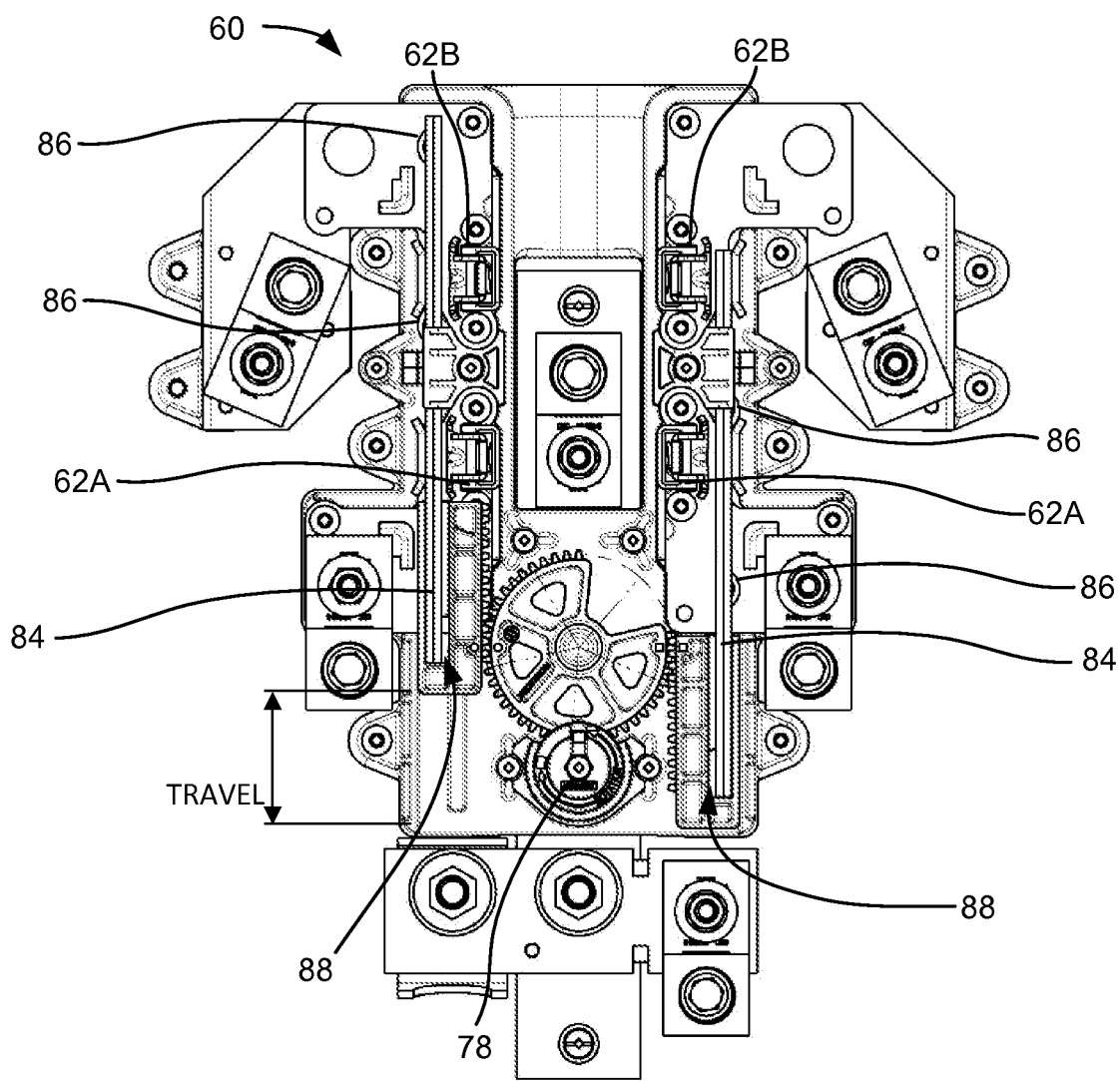
FIGS. 6A and 6B are front views and front perspective views, respectively, of the inside of the watt-hour meter assembly in a metered configuration.
Figure 6B:
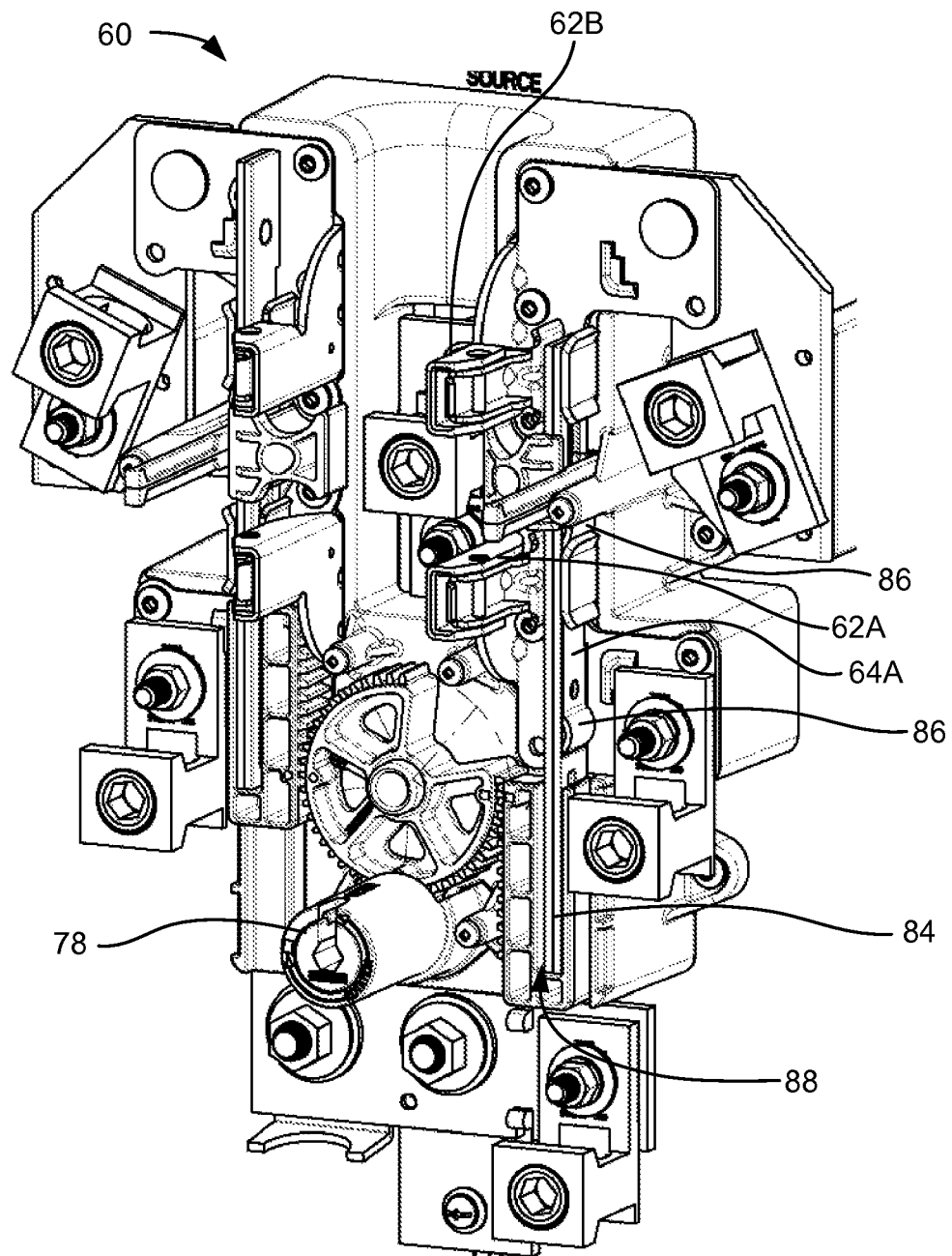
Figure 7A:
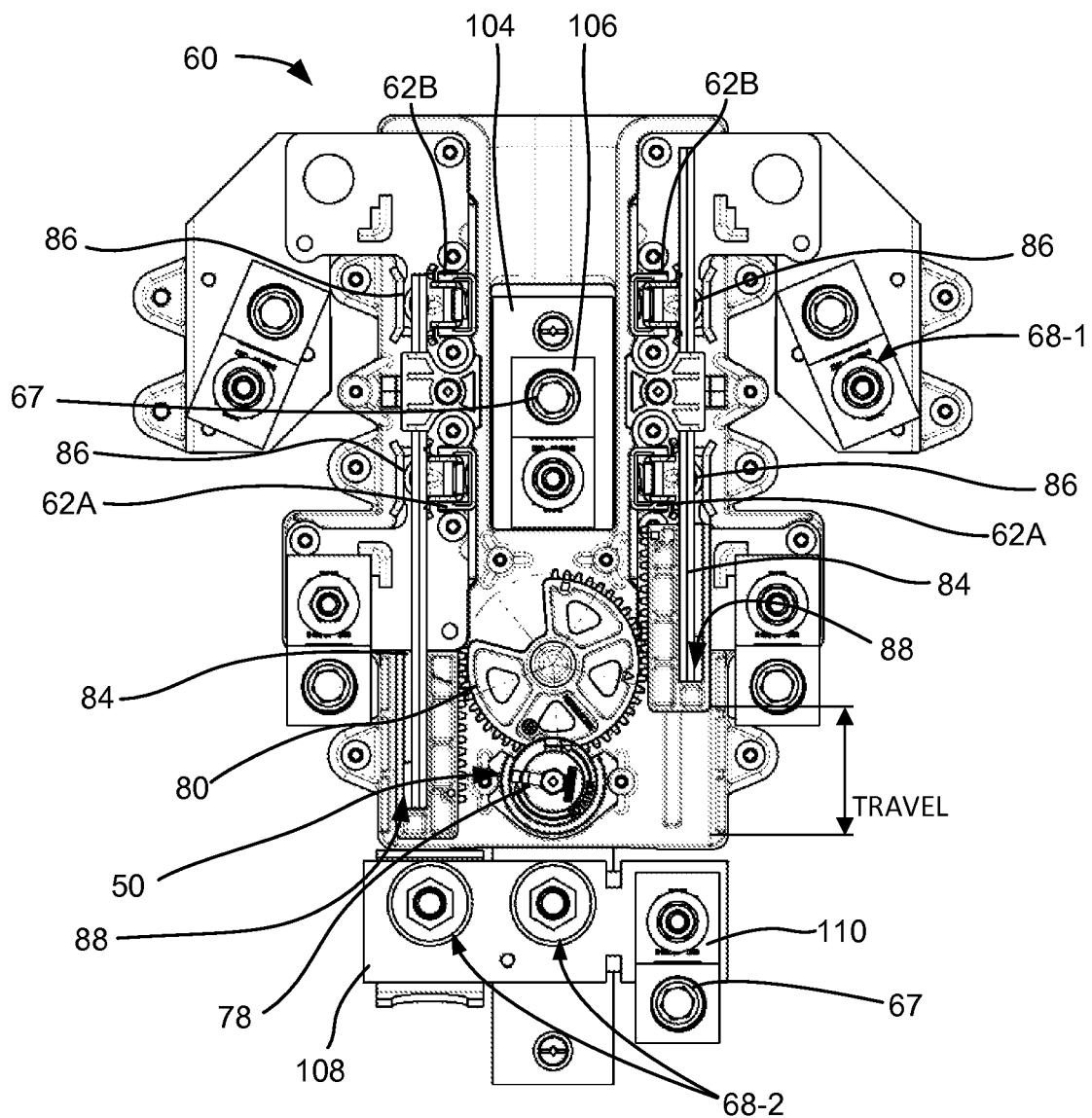
FIGS. 7A and 7B are front views and front perspective views, respectively, of the inside of the watt-hour meter assembly in a bypassed configuration.
Figure 7B:
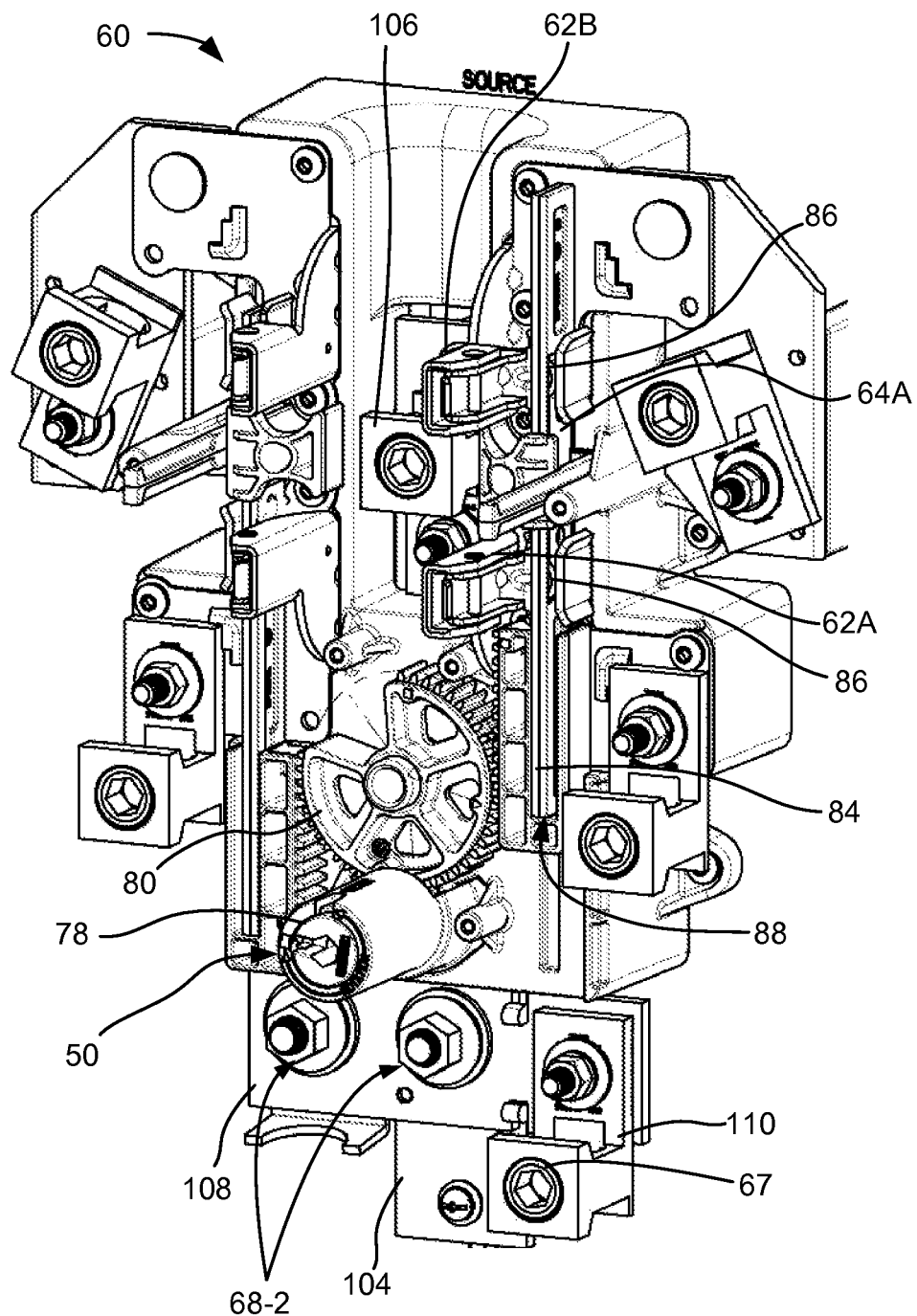

FIGS. 6A and 6B are front and front perspective views of the inside of watt-hour meter assembly 10 in a metered configuration. FIGS. 7A and 7B are front and front perspective views of the inside of watt-hour meter assembly 10 in a bypassed configuration. Security guard 72 and gear cover 74 are not included in FIGS. 6A-7B for clarity. Referring to FIGS. 6A and 6B, in an open (e.g., metered) configuration, there is no conductive path between a lower set of meter jaws 62A and an upper set of meter jaws 62B (e.g., unless meter 26 is installed). One bypass conductor member 64A is positioned such that both protrusions 86 of bypass conductor member 64A are generally aligned with the lower set of meter jaws 62A. Another bypass conductor member 64B (not visible) is positioned such that both protrusions 86 of bypass conductor member 64B are generally aligned with the upper set of meter jaws 62B. The linear path of travel of linear bypass guide 82, bypass conductor holder 84, and bypass conductor member 64 provides a relatively large spacing between the sets of live meter jaws 62A/62B and bypass conductor members 64A/64B.

Referring to FIGS. 7A and 7B, in a bypass (e.g., closed) configuration, bypass conductor members 64 are moved to form a conductive path between the lower set of meter jaws 62A and the upper set of meter jaws 62B. More particularly, rotation of key shaft 78 causes translation gear 80 to rotate, which causes bypass conductor member 64A to slide up and bypass conductor member 64B to slide down until protrusions 86 contact respective meter jaws 62A and 62B. The contact of protrusions 86 with meter jaws 62A/62B may cause bypass conductor holders 84 to slide inwardly within their respective channels 88.

Figure 19:
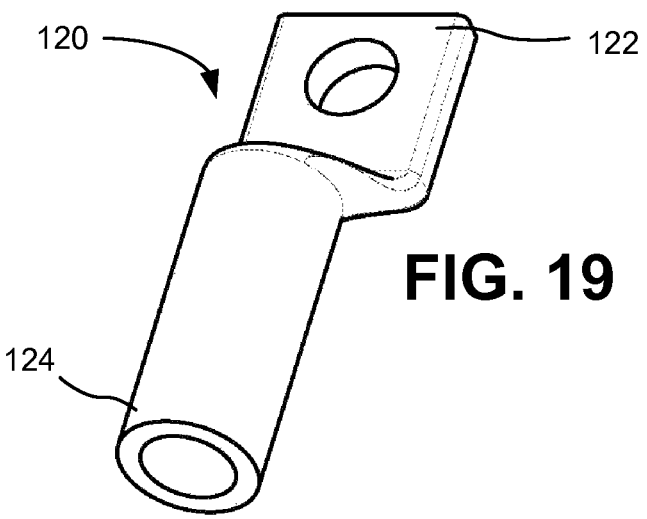
FIG. 19 provides an isometric view of a compression lug according to an implementation described herein.

As further shown in FIGS. 7A-7B, meter socket 60 may include a grounded (neutral) bus bar 104 with a neutral connector 106. Bus bar 104 may be secured to non-conductive base 61 and may extend under bypass activator 50 and translating gear 80. Bus bar 104 may be further configured to receive a crosspiece 108, which may provide a connection location for another neutral connector 110. Bus bar 104 and/or crosspiece 108 may also include studs 68-2 to secure bus bar 104 and crosspiece together and/or to secure one or more grounding/neutral connectors, such as underground compression lug 120 (FIG. 19). Neutral connectors 106 and 110 may be configured similarly to connectors 66 described above.

Figure 8:
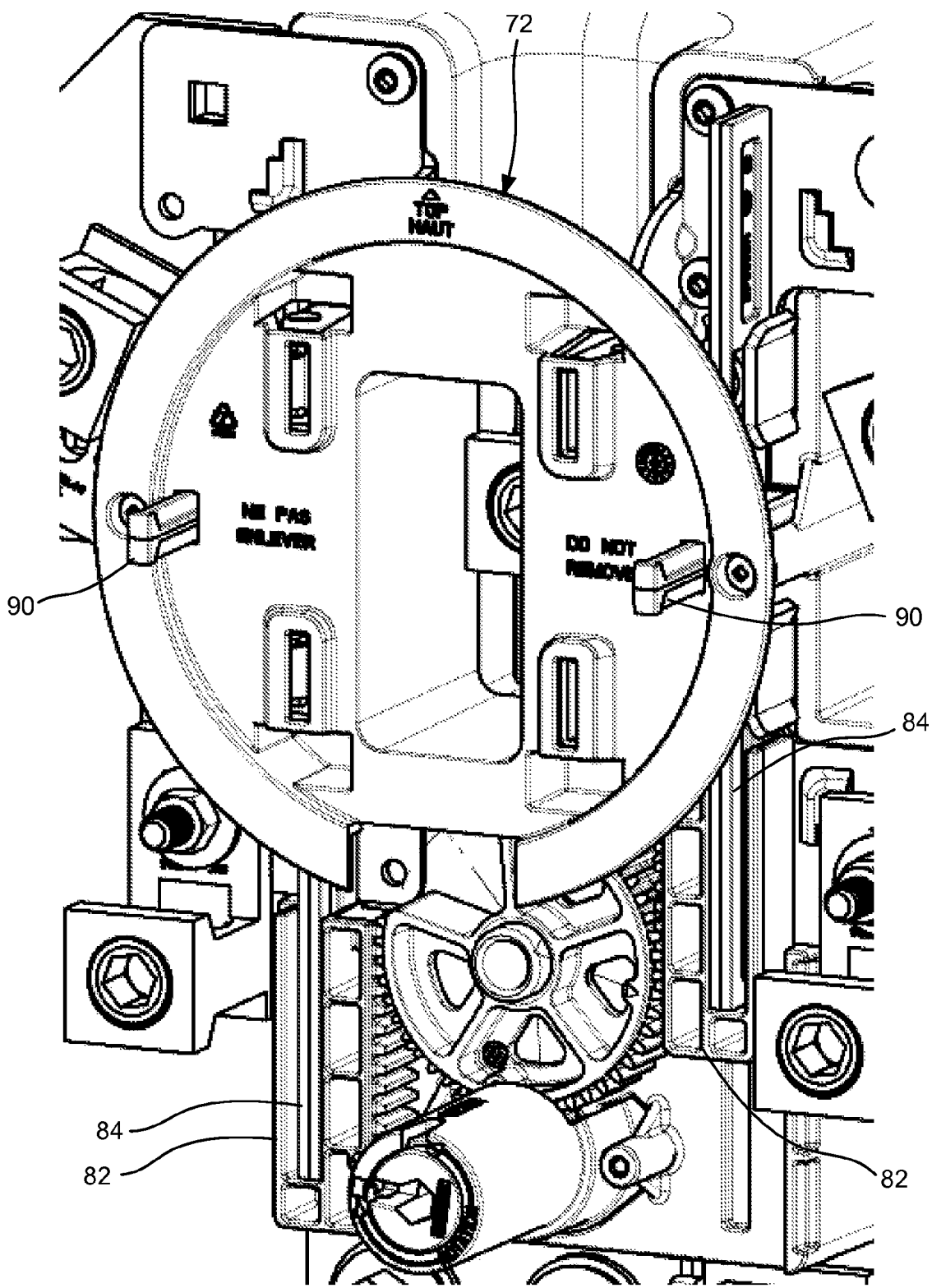
FIG. 8 is an enlarged front perspective view of another portion of the inside of the watt-hour meter assembly with the gear cover removed.
Figure 9:
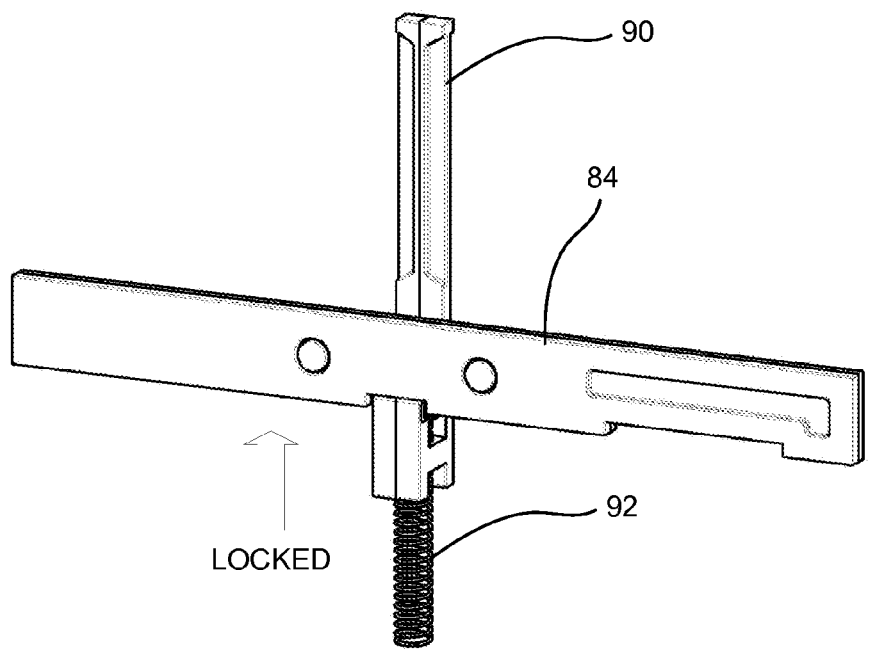
FIGS. 9 and 10 are diagrams of a plunger operation according to an implementation described herein.
Figure 10:
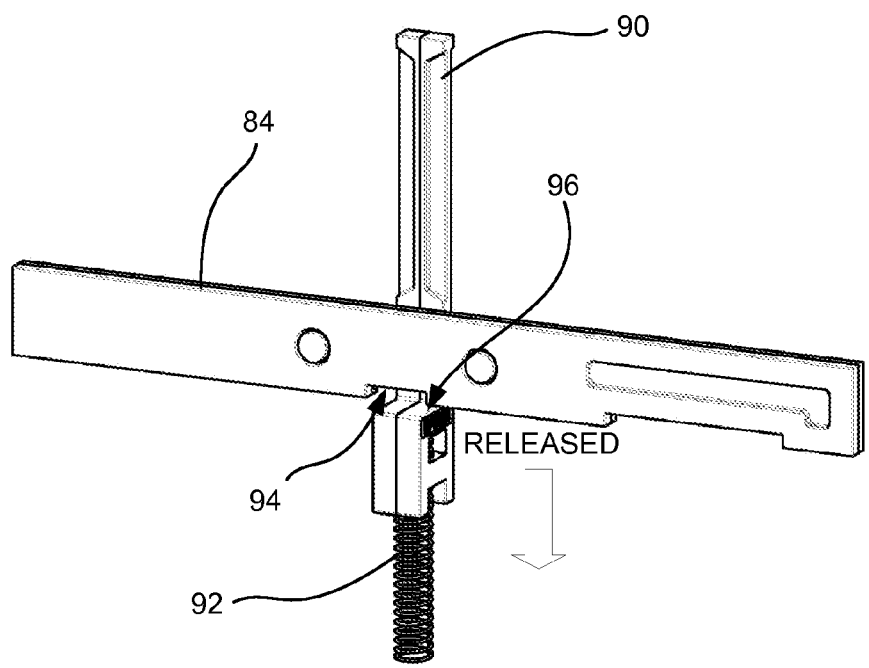

FIG. 8 is an enlarged front perspective view of another portion of the inside of the watt-hour meter assembly 10 with gear cover 74 removed. FIGS. 9 and 10 are diagrams of a plunger 90 operation according to an implementation described herein. As shown in FIG. 8, plunger 90 may be associated with each bypass conductor holder 84. Each plunger 90 may extend through a respective aperture in meter security guard 72. Plungers 90 may prevent deactivation of the bypass (e.g., by an electrician causing rotation of bypass activator 50) without meter 26 in place. As shown in FIG. 9, spring 92 may apply an upward force that causes plunger 90 to engage bypass conductor holder 84 and lock bypass conductor holder 84 in places. As shown in FIG. 10, bypass conductor holder 84 may include a notch 94 that aligns with a groove 96 of plunger 90 when bypass conductor holder 84 is in a closed (e.g., bypassed) position. Removal of meter 26 (e.g., after bypass conductor holder 84 has slid into a bypass position) may allow spring 92 to move plunger 90 upward to engage bypass conductor holder 84. A subsequent installation of meter 26 applies a downward force onto plunger 90 to release plunger 90 (e.g., disengaging notch 94 and groove 96) and permit linear movement of bypass conductor holder 84. Plungers 90 provide a security feature, as deactivating the current bypass without meter 26 in place can cause an arc flash, and, consequently, result in significant injury.

FIG. 11 is a cutaway perspective view of bypass activator cover plate 30 in a partially-closed orientation. FIG. 12 is a front view of the bypass activator in a metered position, and FIG. 13 is a front view of the bypass activator in a bypass position. As shown previously in FIGS. 2 and 3, cover plate 30, when closed, prevents access to bypass activator 50. Referring collectively to FIGS. 11-13, lock sleeve 76 may include a stationary notch 98. Key shaft 78 may include a notch 100 that rotates with key shaft 78 when bypass activator 50 is rotated (e.g., between a metered and bypass position).

When bypass activator 50 is in the open (e.g., metered) position, notch 98 and notch 100 may be aligned such that indexing protrusion 42 may fit into both notches, allowing cover plate 30 to be fully closed. When bypass activator 50 is in the active (e.g., bypass) position, notch 98 and notch 100 are not aligned such that indexing protrusion 42 cannot fit into notch 100, preventing cover plate 30 from being fully closed. The required alignment of indexing protrusion 42 with notch 98 and notch 100 may prevent a technician from forgetting to deactivate the bypass once repair/replacement of meter 26 is complete.

Figure 14:
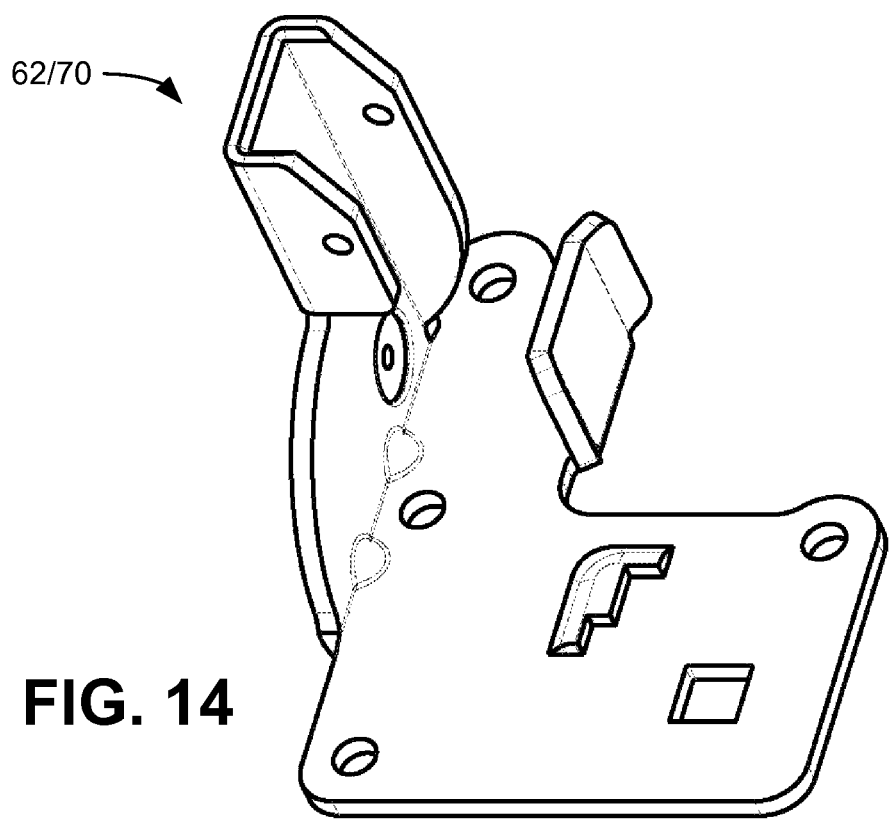
FIG. 14 is a perspective view of a meter jaw for the meter socket of FIG. 1.
Figure 15:
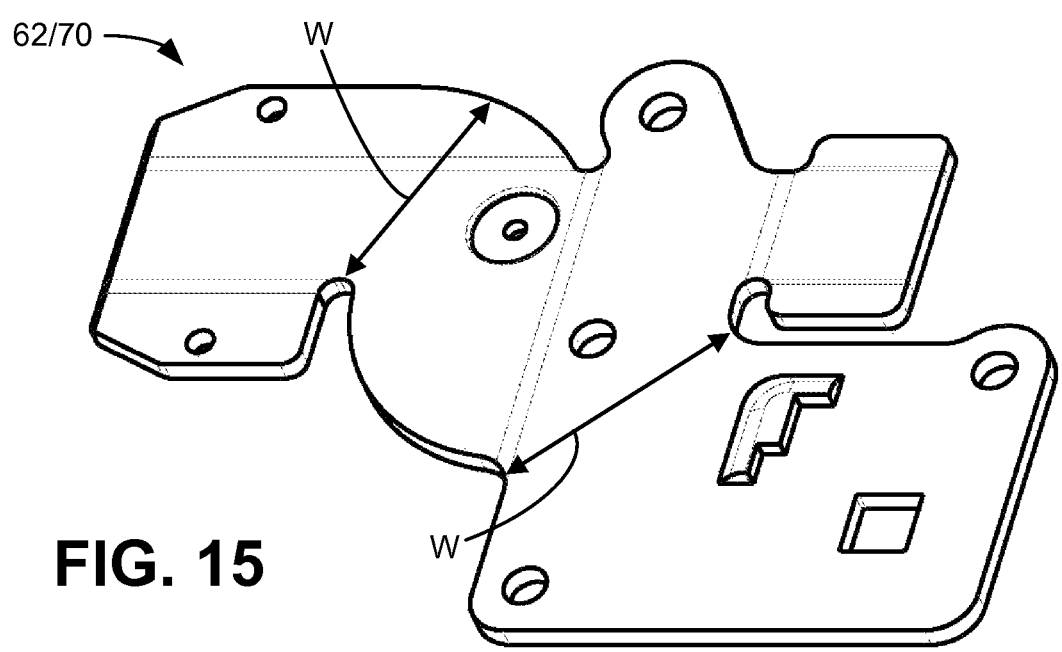
FIG. 15 is a perspective view of a partially-fabricated meter jaw of FIG. 14.

FIG. 14 is a perspective view of meter jaw 62/conductive plate 70. FIG. 15 is a perspective view of a partially-fabricated meter jaw 62/conductive plate 70. As shown in FIGS. 14 and 15, meter jaw 62 and conductive plate 70 may include a one-piece design formed from a single conductive metal sheet. The conductive metal sheet may include a minimum cross-section defined by the thickness of conductive metal sheet 102 at widths, W. The minimum cross-sectional area may be larger than conventional meter socket jaws and, thus, provide improved conductivity between meter jaw 62 and a connector 66 (e.g., when attached to conductive plate 70 via fastener 68). In other implementations, meter jaw 62 and conductive plate 70 may be formed from two or more joined pieces.

Figure 16:
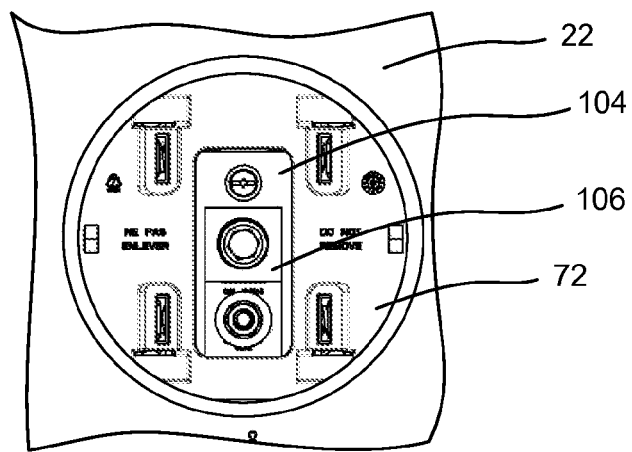
FIG. 16 is a front view of a portion of the meter socket assembly of FIG. 1, with the meter socket removed.
Figure 17:
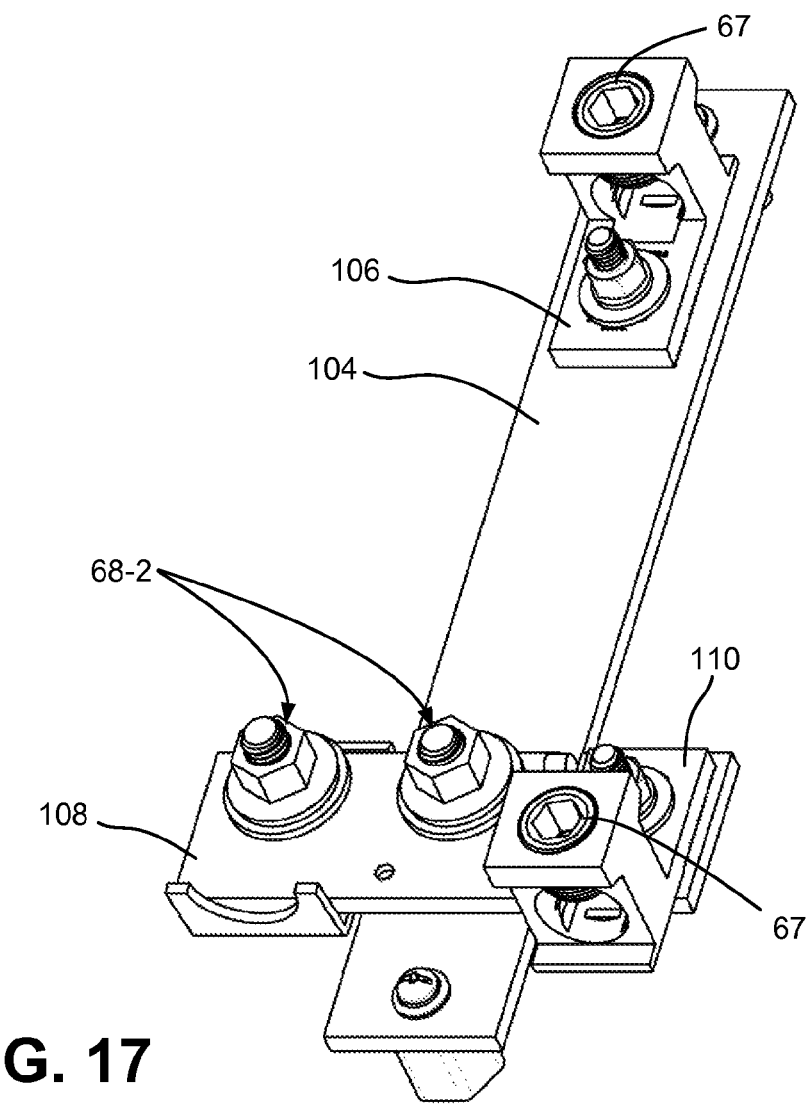
FIG. 17 is a front view of the neutral connector assembly of the meter socket assembly.

FIG. 16 is a front view of a portion of the meter socket assembly 10, with the meter socket removed. FIG. 17 is a front perspective view of the neutral connector assembly of the meter socket assembly. As shown previously in FIG. 7, meter socket 60 may include grounded (neutral) bus bar 104 with a neutral connector 106. Per standard electrical practices, components connected to meter socket assembly 10 are also connected to grounded (neutral) bus bar 104. As shown in FIG. 16, the location of neutral connector 106 provides for easy connections in both overhead and underground installations. Furthermore, bus bar 104 and neutral connector 106 are arranged such that neutral connector 106 is visible beneath meter security guard 72. Thus, with meter 26 removed, technicians can see through meter security guard 72 to verify if connections to neutral connector 106 have been installed. In one implementation, bus bar 104 may be configured to receive crosspiece 108, which may provide a connection location for another neutral connector 110.

Figure 18:
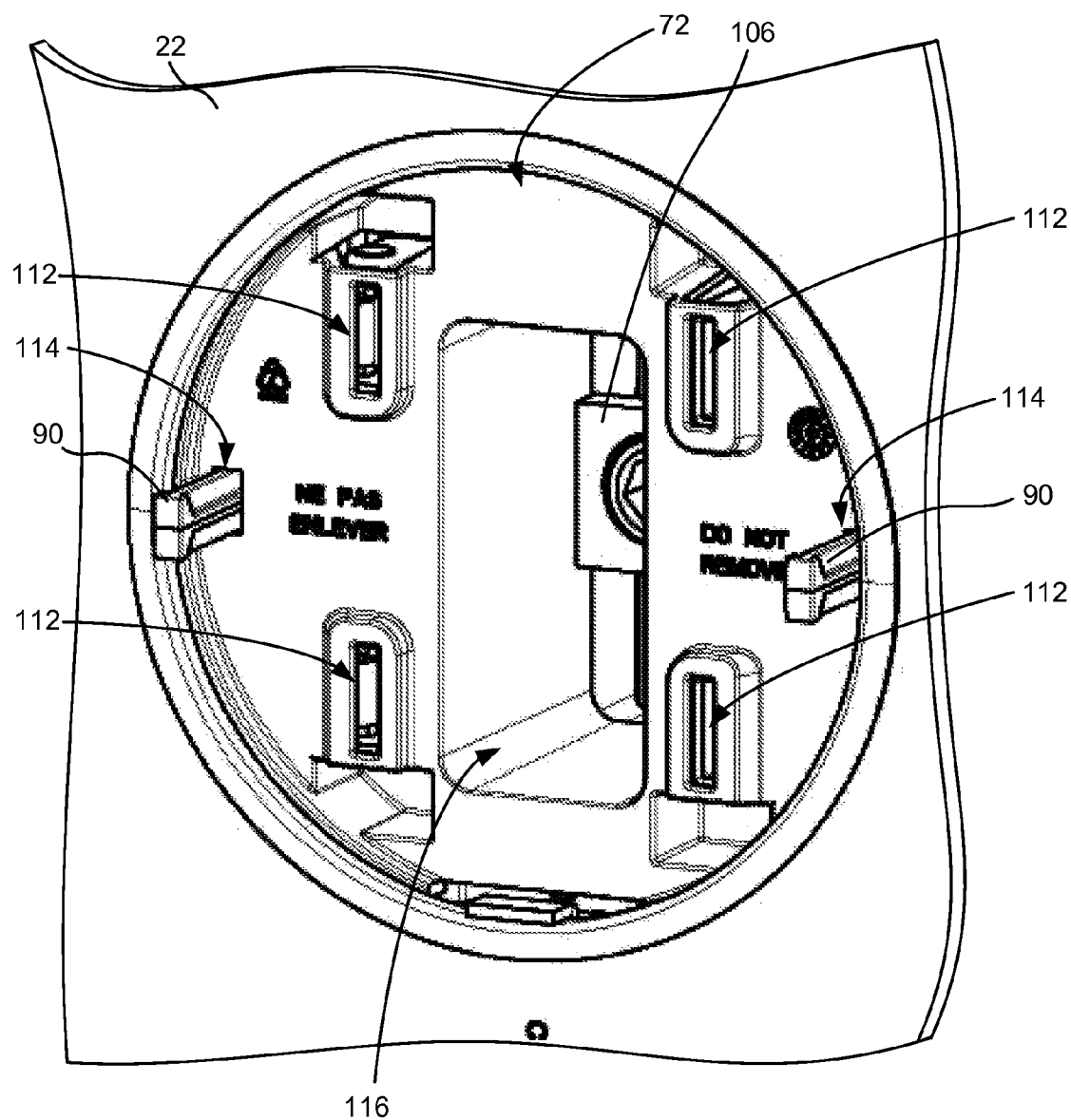
FIG. 18 is the front view of the portion of the meter socket assembly of FIG. 16, with the meter security guard shown in an opaque format.

FIG. 18 is the front perspective view of a portion of meter socket assembly 10 showing the coverage area of meter security guard 72. Meter security guard 72 may generally prevent access to live parts of meter socket assembly 10 while allowing for connectivity of watt-hour meter 26. In one implementation, as shown in FIG. 18, meter security guard 72 may generally include a clear non-conductive material with blade apertures 112, plunger apertures 114, and a neutral aperture 116. Blade apertures 112 may permit meter jaws 62 to receive blades of watt-hour meter 26. Plunger apertures 114 may permit plungers 90 to contact watt-hour meter 26 when meter socket is installed in meter jaws 62. Neutral aperture 116 may provide access to neutral connector 106. In one implementation, neutral aperture 116 may be recessed, such that meter security guard 72 includes walls extending from the plane of apertures 112 and 114 to a different plane of neutral aperture 116. The walls of neutral aperture 116 may prevent contact with, for example, sides of meter jaws 62.

FIG. 19 provides an isometric view of a compression lug 120 according to an implementation described herein. Underground compression lug 120 may be secured, for example, to studs 68 to provide an underground connection for line cables or neutral cables. Underground compression lug 120 may include a flat end 122 with an aperture that may be secured to stud 68 and a tubular end 124. A cable may be inserted into tubular end 124, and tubular end 124 may be crimped over a cable to secure the cable within tubular end 124. Underground compression lug 120 may be used, for example, to meet underground installation requirements.

Figure 21:
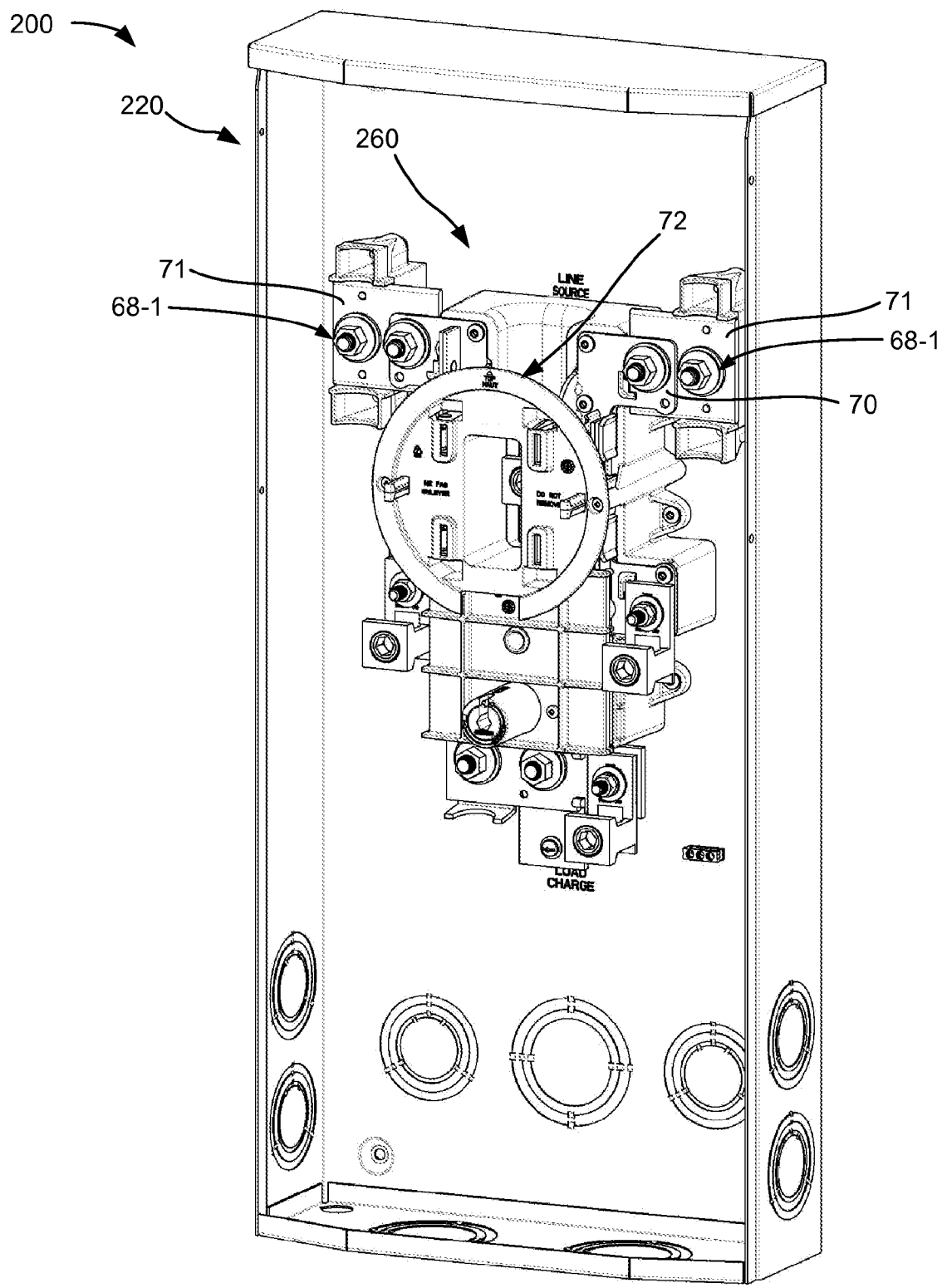
FIG. 21 is a front perspective view of an of inside of a watt-hour meter assembly configured for underground service feeds.

FIG. 21 is a front perspective view of the inside of a watt-hour meter assembly 200 configured for underground service feeds. As shown in FIG. 21, a meter socket 260 may be mounted to a panel attached to the back wall of a meter box 220. Meter box 220 may be substantially similar to meter box 20 with the exception that no line access is provided from a top of meter box 220 and that meter box 220 may be wider than meter box 20 to accommodate meter socket 260. Meter box 220 may include an appropriately-sized removable front cover 22 (not shown).

Meter socket 260 may include features similar to those described above with respect to meter socket 60. However, conductive plates 70 and/or bus bars 71 may be configured differently than in meter socket 60 to better accommodate line feeds coming in from the bottom of meter box 220 up to studs 68-1. Thus, the width of meter socket 260 for underground feeds may be slightly greater than width of a similarly configured meter socket 60 (e.g., for overhead feeds).

In implementations described herein, a meter box may include a meter socket with a set of meter jaws to receive a watt-hour meter. A bypass conductor member may be moveable between an open position and a closed position to connect the meter jaws and provide a bypass for the watt-hour meter. A front cover for the meter box may include a hole in which the watt-hour meter may extend through. An activator for the bypass conductor member may be accessible to a user without opening the front cover. The activator may selectively move the bypass conductor member between the open position and the closed position.

The foregoing description of exemplary implementations provides illustration and description, but is not intended to be exhaustive or to limit the embodiments described herein to the precise form disclosed. Modifications and variations are possible in light of the above teachings or may be acquired from practice of the embodiments.

Although the invention has been described in detail above, it is expressly understood that it will be apparent to persons skilled in the relevant art that the invention may be modified without departing from the spirit of the invention. Various changes of form, design, or arrangement may be made to the invention without departing from the spirit and scope of the invention. Therefore, the above mentioned description is to be considered exemplary, rather than limiting, and the true scope of the invention is that defined in the following claims.

No element, act, or instruction used in the description of the present application should be construed as critical or essential to the invention unless explicitly described as such. Also, as used herein, the article "a" is intended to include one or more items. Further, the phrase "based on" is intended to mean "based, at least in part, on" unless explicitly stated otherwise.

What is claimed is:

1. A meter box, comprising:
    a meter socket including a set of meter jaws to receive a watt-hour meter;
    a bypass conductor member that is moveable between an open position and a closed position to connect the meter jaws and provide a bypass for the watt-hour meter;
    an activator for the bypass conductor member, to selectively move the bypass conductor member between the open position and the closed position; and
    a front cover including a hole in which the watt-hour meter extends through, an aperture through which to access the activator, and a cover plate for the activator,
    wherein the activator is accessible to a user without opening the front cover.

2. The meter box of claim 1, wherein the activator is configured to receive rotational motion from a key, and wherein the meter box further comprises one or more gears to translate the rotational motion to linear motion of the bypass conductor member.

3. The meter box of claim 1, wherein the cover plate and the watt-hour meter are configured to be sealed with a single sealing device.

4. The meter box of claim 1, wherein the cover plate and activator include a mechanical index to prevent closure of the cover plate when the bypass conductor member is in the closed position.

5. The meter box of claim 1, further comprising:
    a plunger configured to prevent movement of the bypass conductor member from the closed position to the open position when the watt-hour meter is not connected to the meter jaws.

6. The meter box of claim 1, further comprising:
    a meter security guard to permit connections between blades of the watt-hour meter and the meter jaws and to prevent access to other components when the watt-hour meter is removed.

7. The meter box of claim 6, further comprising:
    a neutral bus bar, and
    a neutral connector,
    wherein the meter security guard includes an aperture to provide access to the neutral connector when the meter is removed.

8. The meter box of claim 1, further comprising:
    the watt-hour meter.

9. A meter socket for a meter box, comprising:
    a set of meter jaws to receive a watt-hour meter;
    a bypass conductor member to selectively connect the meter jaws to the watt-hour meter and provide a bypass for the watt-hour meter;
    an activator for the bypass conductor member, wherein the activator is configured to be activated by a user through the meter box in a closed position, to move the bypass conductor member from a metered position to a bypass position;
    a meter security guard to permit connections between blades of the watt-hour meter and the set of meter jaws and to prevent access to other components when the watt-hour meter is removed;
    a neutral bus bar; and
    a neutral connector, wherein the meter security guard includes an aperture to provide access to the neutral connector when the meter is removed,
    wherein the meter box comprises a front cover including a hole in which the watt-hour meter extends through.

10. The meter socket of claim 9, wherein the activator is configured to receive rotational motion from a key, and wherein the meter socket further comprises one or more gears to translate the rotational motion to linear motion of the bypass conductor member.

11. The meter socket of claim 9, wherein the activator is further configured to extend through an aperture of the front cover of the meter box.

12. The meter socket of claim 9, wherein the activator includes a mechanical index to prevent closure of an activator cover plate when the bypass conductor member is in the bypass position.

13. The meter socket of claim 9, further comprising:
a plunger configured to prevent movement of the bypass conductor member from the bypass position to the metered position when the watt-hour meter is not connected to the meter jaws.

14. The meter socket of claim 13, wherein the plunger extends through another aperture in the meter security guard.

15. A meter socket, comprising:
a set of meter jaws to receive a watt-hour meter;
a bypass conductor member to selectively connect the meter jaws and provide a bypass for the watt-hour meter;
an activator for the bypass conductor member, wherein the activator is configured to receive rotational motion;
one or more gears to translate the rotational motion to linear motion of the bypass conductor member to move the bypass conductor member from a metered position to a bypass position;
a meter security guard to permit connections between blades of the watt-hour meter and the set of meter jaws and to prevent access to other components when the watt-hour meter is removed; and
a neutral connector, wherein the meter security guard includes an aperture to provide access to the neutral connector when the meter is removed,
wherein the meter socket is enclosed by a meter box which comprises a front cover.

16. The meter socket of claim 15, wherein the activator is further configured to extend through an aperture of the front cover of the meter box.

17. The meter socket of claim 15, further comprising:
a plunger configured to prevent movement of the bypass conductor member from the bypass position to the metered position when the watt-hour meter is not connected to the meter jaws.

18. The meter socket of claim 17, wherein the plunger extends through another aperture in the meter security guard.

19. The meter socket of claim 15, wherein the rotational motion is provided via a key inserted by a user.

20. The meter socket of claim 15, wherein the neutral connector includes a solderless-type lug with a retaining screw.

* * * * *